(12) United States Patent
Park

(10) Patent No.: US 12,265,128 B2
(45) Date of Patent: Apr. 1, 2025

(54) BATTERY MANAGEMENT SYSTEM AND METHOD FOR COMMUNICATING USING INTERMEDIATE NODE

(71) Applicant: LG ENERGY SOLUTION, LTD., Seoul (KR)

(72) Inventor: Chan Ha Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 739 days.

(21) Appl. No.: 17/601,591

(22) PCT Filed: Sep. 7, 2020

(86) PCT No.: PCT/KR2020/012071
§ 371 (c)(1),
(2) Date: Oct. 5, 2021

(87) PCT Pub. No.: WO2021/049838
PCT Pub. Date: Mar. 18, 2021

(65) Prior Publication Data
US 2022/0179001 A1   Jun. 9, 2022

(30) Foreign Application Priority Data

Sep. 9, 2019   (KR) ........................ 10-2019-0111783

(51) Int. Cl.
*H04Q 9/00* (2006.01)
*G01R 31/36* (2020.01)
(Continued)

(52) U.S. Cl.
CPC .......... *G01R 31/36* (2013.01); *H01M 10/425* (2013.01); *H01M 10/48* (2013.01); *H04Q 9/00* (2013.01);
(Continued)

(58) Field of Classification Search
CPC ... G01R 31/36; G01R 31/371; H01M 10/425; H01M 10/48; H01M 10/482;
(Continued)

(56) References Cited

U.S. PATENT DOCUMENTS 6,762,588 B2 * 7/2004 Miyazaki .............. H02J 7/0016
320/116
6,891,352 B2 * 5/2005 Miyazaki ............ H01M 10/482
320/118
(Continued)

FOREIGN PATENT DOCUMENTS

CN    103270666 A    8/2013
CN    103580090 A    2/2014
(Continued)

OTHER PUBLICATIONS

Extended European Search Report dated Jul. 15, 2022 issued by the European Patent Office in corresponding European Patent Application No. 20863211.7.

*Primary Examiner* — John T Trischler
(74) *Attorney, Agent, or Firm* — MORGAN, LEWIS & BOCKIUS LLP

(57) ABSTRACT

A battery management device according to an embodiment of the present invention includes an upper-level controller that transmits a command signal to a lower-level controller and receives a response signal to the command signal from the lower-level controller and a lower-level controller that performs an operation according to the command signal received from the upper-level controller and transmits the response signal to the command signal to the upper-level controller, and an intermediate lower-level controller selected according to a predetermined criterion among the lower-level controllers transmits a signal corresponding to the command signal transmitted by the upper-level controller with maximum power to the remaining lower-level (Continued)

controllers when strength of the command signal received from the upper-level controller satisfies a preset condition.

14 Claims, 10 Drawing Sheets

(51) Int. Cl.
   *H01M 10/42*     (2006.01)
   *H01M 10/48*     (2006.01)
   *H04B 17/318*    (2015.01)

(52) U.S. Cl.
   CPC ........... *H01M 2010/4271* (2013.01); *H01M 2010/4278* (2013.01); *H04B 17/318* (2015.01)

(58) Field of Classification Search
   CPC ......... H01M 10/4257; H01M 10/4207; H01M 10/4278; H01M 10/4271; H01M 2010/4271; H01M 2010/4278; H04Q 9/00; H04Q 2209/40; Y02E 60/10; G08C 17/02; H04B 17/318
   USPC ............................................................ 320/107
   See application file for complete search history.

(56) References Cited

U.S. PATENT DOCUMENTS

| | | | | |
|---|---|---|---|---|
| 7,091,695 B2* | 8/2006 | Miyazaki | ............... | B60L 58/21 320/116 |
| 7,528,581 B2* | 5/2009 | Miyazaki | ............. | H02J 7/00306 320/163 |
| 7,888,945 B2* | 2/2011 | Miyazaki | ............. | H01M 50/569 324/434 |
| 8,098,047 B2* | 1/2012 | Miyazaki | ............. | H01M 10/482 320/163 |
| 8,106,661 B2* | 1/2012 | Miyazaki | ............. | H01M 10/482 324/434 |
| 8,169,190 B2* | 5/2012 | Miyazaki | ............. | B60L 53/11 320/134 |
| 8,226,012 B2* | 7/2012 | Roslak | ............. | G06Q 20/201 235/472.02 |
| 8,253,382 B2* | 8/2012 | Miyazaki | ............. | H02J 7/0019 320/132 |
| 8,283,892 B2* | 10/2012 | Miyazaki | ............. | B60L 53/11 320/134 |
| 8,432,132 B2* | 4/2013 | Nakanishi | ............. | H02J 7/0016 320/132 |
| 8,436,575 B2 | 5/2013 | Sim et al. | | |
| 8,666,687 B2* | 3/2014 | Kaneko | ............. | H02J 7/0013 702/63 |
| 8,896,273 B2* | 11/2014 | Miyazaki | ............. | B60L 53/11 320/163 |
| 9,293,935 B2* | 3/2016 | Lee | .......... | H04Q 9/00 |
| 9,306,409 B2* | 4/2016 | Yoo | ............. | H02J 3/32 |
| 9,352,905 B2* | 5/2016 | Fly | ............. | B65G 1/02 |
| 9,444,273 B1* | 9/2016 | Gothoskar | ............. | H04W 4/20 |
| 9,496,730 B2* | 11/2016 | Gallegos | ............. | B60L 58/26 |
| 9,553,460 B2* | 1/2017 | Dao | ............. | H02J 7/0013 |
| 9,647,463 B2* | 5/2017 | Brandl | ............. | H02J 7/0014 |
| 9,768,832 B2* | 9/2017 | Nishibayashi | ............. | H02J 3/32 |
| 9,895,991 B2* | 2/2018 | Kim | ............. | B60L 58/12 |
| 9,918,283 B2* | 3/2018 | Braxton | ............. | H04W 52/247 |
| 10,045,308 B2* | 8/2018 | Braxton | ............. | G08B 3/10 |
| 10,193,190 B2* | 1/2019 | Yamazoe | ............. | H01M 10/425 |
| 10,447,528 B2* | 10/2019 | Ohmae | ............. | H04B 17/318 |
| 10,476,297 B2* | 11/2019 | Jung | ............. | H02J 7/0031 |
| 10,491,007 B2* | 11/2019 | Kim | ............. | H02J 7/0018 |
| 10,716,071 B2* | 7/2020 | Kumar | ............. | H04W 52/367 |
| 10,862,567 B2* | 12/2020 | Li | ............. | H04B 1/44 |
| 10,915,386 B2* | 2/2021 | Cho | ............. | H02J 3/32 |
| 10,938,221 B1* | 3/2021 | Tenorio | ............. | H02J 7/0048 |
| 10,944,278 B1* | 3/2021 | Kang | ............. | H02J 7/00712 |
| 10,944,279 B1* | 3/2021 | Chen | ............. | H02J 7/0047 |
| 10,966,160 B2* | 3/2021 | Kumar | ............. | H04W 52/247 |
| 11,011,917 B2* | 5/2021 | Park | ............. | H02J 7/0047 |
| 11,038,216 B2* | 6/2021 | Kwon | ............. | H02J 7/00 |
| 11,095,140 B1* | 8/2021 | Chen | ............. | H02J 7/0048 |
| 11,105,860 B2* | 8/2021 | Takeshita | ............. | H03K 21/40 |
| 11,133,690 B1* | 9/2021 | Chen | ............. | H02J 7/0063 |
| 11,146,090 B2* | 10/2021 | Dan | ............. | G01R 31/3842 |
| 11,165,263 B2* | 11/2021 | Sung | ............. | H02J 7/00 |
| 11,304,110 B2* | 4/2022 | Catalli | ............. | H04W 36/385 |
| 11,335,961 B2* | 5/2022 | Moen | ............. | H01M 10/486 |
| 11,356,824 B2* | 6/2022 | Park | ............. | H04L 12/403 |
| 11,428,742 B2* | 8/2022 | Park | ............. | H04L 12/403 |
| 11,606,760 B2* | 3/2023 | Kumar | ............. | H04W 52/143 |
| 11,637,440 B2* | 4/2023 | Dan | ............. | H04W 52/0219 320/132 |
| 11,688,887 B2* | 6/2023 | Choi | ............. | H04L 41/044 702/63 |
| 11,699,908 B2* | 7/2023 | Chen | ............. | H01M 10/425 320/112 |
| 11,789,084 B2* | 10/2023 | Sung | ............. | H02J 7/00 429/50 |
| 11,929,469 B2* | 3/2024 | Zhang | ............. | H01M 10/4207 |
| 11,961,977 B2* | 4/2024 | Irish | ............. | H01M 50/51 |
| 11,984,750 B2* | 5/2024 | Kwon | ............. | H01M 10/4207 |
| 12,040,458 B2* | 7/2024 | Choi | ............. | H04L 43/0817 |
| 12,081,511 B2* | 9/2024 | Hwang | ............. | H04L 61/3015 |
| 12,113,378 B2* | 10/2024 | Liu | ............. | H02J 7/00712 |
| 2003/0044689 A1 | 3/2003 | Miyazaki et al. | | |
| 2004/0178768 A1* | 9/2004 | Miyazaki | ............. | H01M 10/482 320/116 |
| 2005/0242775 A1* | 11/2005 | Miyazaki | ............. | B60L 58/21 320/116 |
| 2007/0018613 A1* | 1/2007 | Miyazaki | ............. | H01M 10/482 320/116 |
| 2008/0061740 A1* | 3/2008 | Miyazaki | ............. | B60L 53/11 320/116 |
| 2008/0067978 A1* | 3/2008 | Miyazaki | ............. | H02J 7/0019 320/116 |
| 2008/0079395 A1* | 4/2008 | Miyazaki | ............. | B60L 50/64 320/118 |
| 2009/0169987 A1* | 7/2009 | Miyazaki | ............. | B60L 58/21 429/158 |
| 2009/0261781 A1* | 10/2009 | Miyazaki | ............. | H01M 10/425 320/116 |
| 2009/0284223 A1* | 11/2009 | Miyazaki | ............. | B60L 53/11 320/163 |
| 2009/0284224 A1* | 11/2009 | Miyazaki | ............. | H02J 7/0019 320/118 |
| 2009/0302802 A1* | 12/2009 | Miyazaki | ............. | H02J 7/0019 320/166 |
| 2010/0286938 A1* | 11/2010 | Kaneko | ............. | H01M 10/482 702/63 |
| 2010/0297944 A1* | 11/2010 | Lee | ............. | H04B 17/318 455/41.2 |
| 2011/0080138 A1 | 4/2011 | Nakanishi | | |
| 2011/0175574 A1* | 7/2011 | Sim | ............. | H01M 10/482 320/121 |
| 2011/0320379 A1* | 12/2011 | Roslak | ............. | G06Q 20/201 705/345 |
| 2012/0105001 A1* | 5/2012 | Gallegos | ............. | B60L 53/66 320/109 |
| 2012/0286734 A1* | 11/2012 | Miyazaki | ............. | H02J 7/0019 320/118 |
| 2013/0221919 A1* | 8/2013 | Gallegos | ............. | B60L 3/0092 320/109 |
| 2013/0271072 A1 | 10/2013 | Lee et al. | | |
| 2014/0035365 A1 | 2/2014 | Yoo | | |
| 2014/0035532 A1* | 2/2014 | Brandl | ............. | H02J 7/00 320/128 |
| 2014/0347014 A1 | 11/2014 | Lee et al. | | |
| 2014/0350716 A1* | 11/2014 | Fly | ............. | B25H 3/00 700/214 |
| 2015/0028816 A1 | 1/2015 | Lee | | |
| 2015/0063473 A1* | 3/2015 | Nishibayashi | ............. | H02J 13/00 375/257 |
| 2015/0188334 A1 | 7/2015 | Dao et al. | | |

(56) References Cited

U.S. PATENT DOCUMENTS

| | | | |
|---|---|---|---|
| 2016/0198285 A1* | 7/2016 | Lin | H04W 4/38 709/209 |
| 2016/0214500 A1 | 7/2016 | Kim et al. | |
| 2016/0254684 A1* | 9/2016 | Gothoskar | H04W 4/38 455/572 |
| 2016/0268642 A1* | 9/2016 | Yamazoe | H01M 10/425 |
| 2016/0372969 A1* | 12/2016 | Jung | H02J 9/005 |
| 2017/0013569 A1* | 1/2017 | Braxton | G08B 21/0263 |
| 2017/0141588 A1 | 5/2017 | Kim | |
| 2018/0167894 A1* | 6/2018 | Braxton | H04W 52/283 |
| 2018/0212669 A1* | 7/2018 | Li | H04B 7/0604 |
| 2018/0301913 A1 | 10/2018 | Irish et al. | |
| 2018/0351789 A1* | 12/2018 | Ohmae | H04B 7/14 |
| 2019/0086475 A1 | 3/2019 | Takeshita | |
| 2019/0132806 A1 | 5/2019 | Kumar et al. | |
| 2019/0227863 A1* | 7/2019 | Cho | G01R 31/371 |
| 2019/0260097 A1 | 8/2019 | Kwon et al. | |
| 2020/0036194 A1* | 1/2020 | Park | H01M 10/4257 |
| 2020/0083730 A1* | 3/2020 | Dan | G01R 31/392 |
| 2020/0106278 A1* | 4/2020 | Sung | H02J 7/0047 |
| 2020/0200828 A1* | 6/2020 | Sung | H04B 17/318 |
| 2020/0314766 A1* | 10/2020 | Kumar | H04W 52/143 |
| 2021/0025944 A1* | 1/2021 | Park | G01R 31/392 |
| 2021/0037407 A1* | 2/2021 | Park | H01M 10/4207 |
| 2021/0099941 A1* | 4/2021 | Catalli | H04W 36/385 |
| 2021/0111439 A1* | 4/2021 | Moen | H01M 10/486 |
| 2021/0204224 A1* | 7/2021 | Kumar | H04W 24/10 |
| 2021/0242506 A1* | 8/2021 | Zhang | H01M 10/441 |
| 2021/0265670 A1* | 8/2021 | Choi | H04L 12/403 |
| 2021/0320509 A1* | 10/2021 | Irish | H01M 50/51 |
| 2021/0376629 A1* | 12/2021 | Chen | H01M 10/4257 |
| 2021/0408817 A1* | 12/2021 | Dan | H04W 52/0219 |
| 2022/0217118 A1* | 7/2022 | Hwang | H04L 61/5038 |
| 2022/0237029 A1* | 7/2022 | Kwon | H01M 10/4207 |
| 2022/0247841 A1* | 8/2022 | Yang | H04L 12/40 |
| 2022/0294252 A1* | 9/2022 | Cho | H02J 7/00714 |
| 2022/0329086 A1* | 10/2022 | Yang | H01M 10/482 |
| 2022/0352563 A1* | 11/2022 | Park | H02J 7/0036 |
| 2022/0376537 A1* | 11/2022 | Kwon | H02J 7/00036 |
| 2023/0071238 A1* | 3/2023 | Hwang | H01M 10/052 |
| 2023/0275276 A1* | 8/2023 | Choi | H04L 43/0817 702/63 |
| 2023/0387696 A1* | 11/2023 | Liu | H02J 7/007 |
| 2024/0266857 A1* | 8/2024 | Kwon | H01M 10/425 |
| 2024/0332648 A1* | 10/2024 | Choi | H04L 41/0695 |
| 2024/0388561 A1* | 11/2024 | Hwang | H01M 10/48 |

FOREIGN PATENT DOCUMENTS

| | | |
|---|---|---|
| CN | 106532163 A | 3/2017 |
| CN | 108736077 A | 11/2018 |
| JP | H08-139660 A | 5/1996 |
| JP | H09-23279 A | 1/1997 |
| JP | H11-261465 A | 9/1999 |
| JP | 2003-70179 A | 3/2003 |
| JP | 2011-101573 A | 5/2011 |
| JP | 2016-133513 A | 7/2016 |
| JP | 2019-53579 A | 4/2019 |
| KR | 10-2009-0003754 A | 1/2009 |
| KR | 10-2017-0058124 A | 5/2017 |
| KR | 10-2018-0100176 A | 9/2018 |
| KR | 10-2019-0005408 A | 1/2019 |
| WO | 2012/061262 A1 | 5/2012 |
| WO | 2015/063945 A1 | 5/2015 |

* cited by examiner

BATTERY MANAGEMENT SYSTEM AND METHOD FOR COMMUNICATING USING INTERMEDIATE NODE

TECHNICAL FIELD

Cross-Reference to Related Applications

This application claims the benefit of Korean Patent Application No. 10-2019-0111783, filed on Sep. 9, 2019, in the Korean Intellectual Property Office, the disclosure of which is incorporated herein in its entirety by reference.

TECHNICAL FIELD

The present invention relates to a battery management system for performing wireless communication using an intermediate node and a communication method thereof.

BACKGROUND ART

In the case of general wireless communication, due to its nature, a communication fault may occur due to a distance between communicating nodes, an obstacle between the nodes, or other wireless communication in the same frequency band. In particular, in the case of a battery management system, since communication should be performed in real time, and thus the communication fault need to be minimized.

In wireless communication between general battery management systems, communication between one master device and a plurality of slaves is performed. In such a case, one master device performs communication in the form of transmitting a command signal to a plurality of slave devices on a one-to-one basis and receiving a response signal to the command signal from the slave device again.

In this case, the master device assigns a unique ID to each slave device when connection with all slave devices is completed, the ID assigned to each slave device is included in a packet of the response signal of the slave device so that all slave devices, including the master device that receives the corresponding packet, are allowed to recognize which slave device transmitted the packet of the response signal.

In addition, the master device transmits a trigger signal commanding battery state measurement several times at a fixed period so that all slave devices are allowed to receive the signal. In addition, the slave devices that have received the signal transmit the measurement signal again to the master device at the point in time allocated through the timer in order at a fixed period.

However, according to this conventional method, in the case where communication interference or obstacles are present between nodes, there was no way to detect the cause and transmit signals to the nodes at long distances.

DISCLOSURE OF THE INVENTION

Technical Problem

An object of the present invention is to provide a battery management system and a communication method between the battery management systems, which enable good communication between the battery management systems by performing wireless communication using an intermediate node even when a communication fault occurs between nodes.

Technical Solution

A battery management device according to an embodiment of the present invention includes an upper-level controller that transmits a command signal to a lower-level controller and receives a response signal to the command signal from the lower-level controller and a lower-level controller that performs an operation according to the command signal received from the upper-level controller and transmits the response signal to the command signal to the upper-level controller, and an intermediate lower-level controller selected according to a predetermined criterion among the lower-level controllers transmits a signal corresponding to the command signal transmitted by the upper-level controller with maximum power to the remaining lower-level controllers when strength of the command signal received from the upper-level controller satisfies a preset condition.

In the battery management device according to the embodiment of the present invention, the upper-level controller may select the intermediate lower-level controller based on the strength of the response signal received from the lower-level controller.

In the battery management device according to the embodiment of the present invention, the upper-level controller may select a lower-level controller whose strength of the response signal received from the lower-level controller is equal to or greater than a preset first reference value as the intermediate lower-level controller.

In the battery management device according to the embodiment of the present invention, the upper-level controller may assign priority to the lower-level controller in order in which the strength of the response signal received from the lower-level controller is high, and select a lower-level controller whose priority is equal to or greater than a preset priority among the lower-level controllers as the intermediate lower-level controller.

In the battery management device according to the embodiment of the present invention, the intermediate lower-level controller may transmit a signal corresponding to the command signal transmitted by the upper-level controller with maximum power to the remaining lower-level controllers when the strength of the command signal received from the upper-level controller is less than a preset second reference value.

In the battery management device according to the embodiment of the present invention, the intermediate lower-level controller may accumulate and store the strength of the command signal received from the upper-level controller, and determine the second reference value based on an average value or a median value of the strength of the stored command signal.

In the battery management device according to the embodiment of the present invention, the upper-level controller may be set to transmit the command signal as many times as a preset number of times of repetition at a preset period, and the intermediate lower-level controller may transmit a signal corresponding to the command signal transmitted by the upper-level controller with maximum power when the command signal is not received as many times as the preset number of times of repetition during the preset period from the upper-level controller.

In the battery management device according to the embodiment of the present invention, when the command signal is not received as many times as the preset number of times of repetition during the preset period from the upper-level controller or the strength of the received command signal is less than the preset second reference value, the intermediate lower-level controller may transmit the command signal as many times as the remaining number of times obtained by subtracting the number of times of not receiving or less than the second reference value from the preset number of times of repetition to the remaining lower controllers with maximum power.

In the battery management device according to the embodiment of the present invention, the command signal and the response signal may include at least one of signal-specific identification information, identification information on the number of repetitions of the signal, and information on battery state measurement.

In the battery management device according to the embodiment of the present invention, the command signal may include a trigger signal for measuring a state of battery module.

A battery management method according to an embodiment of the present invention includes transmitting a command signal from an upper-level controller to a lower-level controller, performing, by the lower-level controller, an operation according to the command signal received from the upper-level controller, transmitting, by the lower-level controller, a response signal to the command signal to the upper-level controller, selecting, by the upper-level controller, an intermediate lower-level controller according to a predetermined criterion among the lower-level controllers, and transmitting, by the intermediate lower-level controller, a signal corresponding to the command signal transmitted by the upper-level controller with maximum power to the remaining lower-level controllers when strength of the command signal received from the upper-level controller satisfies a preset condition.

Effects of the Invention

According to the battery management system and the communication method between battery management systems of the present invention, it is possible to enable good communication between the battery management systems by performing wireless communication using an intermediate node even when a communication fault occurs between nodes.

MODE FOR CARRYING OUT THE INVENTION

Figure 1:
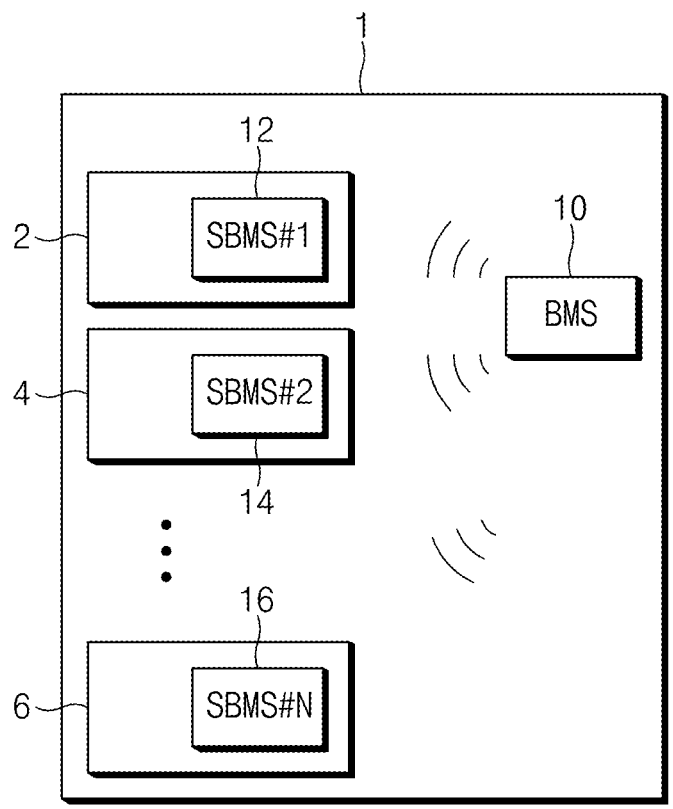
FIG. 1 is a configuration diagram of a battery pack including a battery management system according to an embodiment of the present invention.

Hereinafter, various embodiments of the present invention will be described in detail with reference to the accompanying drawings. In this document, the same reference numerals are used for the same constituent elements in the drawings, and duplicate descriptions for the same constituent elements are omitted.

With respect to the various embodiments of the present invention disclosed in this document, specific structural or functional descriptions have been exemplified for the purpose of describing the embodiments of the present invention only, and various embodiments of the present invention may be embodied in various forms and should not be construed as being limited to the embodiments described in this document.

Expressions such as "first", "second", "firstly", or "secondly", etc. used in various embodiments may modify various constituent elements regardless of order and/or importance, and do not limit corresponding constituent elements. For example, without deviating from the scope of the present invention, a first constituent element may be named as a second constituent element, and similarly, the second constituent element may also be renamed as the first constituent element.

The terms used in this document are only used to describe a specific embodiment, and may not be intended to limit the scope of other embodiments. Singular expressions may include plural expressions unless the context clearly indicates otherwise.

All terms used herein, including technical or scientific terms, may have the same meaning as generally understood by a person of ordinary skill in the art. Terms defined in a generally used dictionary may be interpreted as having the same or similar meaning as the meaning in the context of the related technology, and are not to be interpreted as an ideal or excessively formal meaning unless explicitly defined in this document. In some cases, even terms defined in this document cannot be interpreted to exclude embodiments of the present invention.

FIG. 1 is a configuration diagram of a battery pack including a battery management device according to an embodiment of the present invention.

In a battery module 1, a plurality of battery cells 2, 4, and 6 are connected in series or in parallel. Slave battery management systems 12, 14, and 16 are disposed in the battery cells 2, 4, and 6, respectively. The slave battery management systems 12, 14, and 16 respectively measure and monitor the temperature, voltage, or current of the plurality of battery cells 2, 4, and 6, and transmit monitored information to an upper-level system and control the connected battery cells by receiving a control command of the battery cell from the upper-level system.

The plurality of battery cells 2, 4, and 6 are connected in series or in parallel to form a battery module 1. A master battery management system 10 is disposed in the battery module 1. The master battery management system 10 measures and monitors the temperature, voltage, or current of the battery module 1. In addition, the master battery management system 10 receives monitoring information of each battery cell from the slave battery management systems 12, 14, and 16 respectively disposed in the battery cells, and transmits the monitoring information to the upper system, and receives a specific task execution command from the upper-level system and transmits the specific task execution command to the corresponding slave battery management systems 12, 14, and 16.

Figure 2:
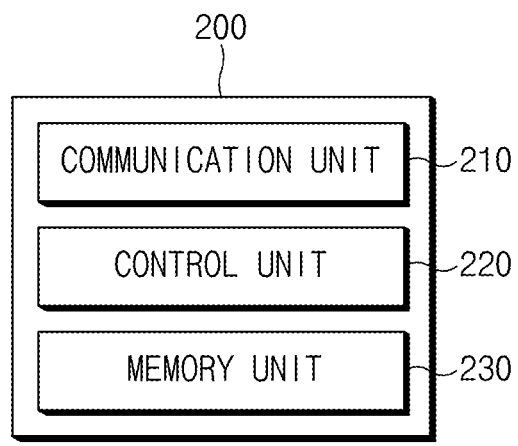
FIG. 2 is a block diagram illustrating a configuration of an upper-level controller according to an embodiment of the present invention.

FIG. 2 is a block diagram illustrating a configuration of an upper-level controller according to an embodiment of the present invention.

Referring to FIG. 2, an upper-level controller 200 according to an embodiment of the present invention may include a communication unit 210, a control unit 220, and a memory unit 230.

The upper-level controller 200 may be, for example, the master battery management system (BMS) described above.

The communication unit 210 may transmit a command signal to the lower-level controller and receive a response signal to the command signal from the lower-level controller 220. The communication unit 210 may transmit and receive signals to and from all the lower-level controllers 220 in a broadcast manner. In this case, the upper-level controller 210 may repeatedly transmit the same signal several times during a fixed period so that the lower-level controller 220 that fails to receive the signal does not occur.

In addition, the communication unit 210 may assign a unique identification ID to each lower-level controller. Accordingly, the upper-level controller 200 may distinguish which signal is transmitted from which lower-level controller through the unique identification ID.

The command signal transmitted by the communication unit 210 may include identification information ID unique to signal, identification information on the number of repetitions of the signal, and information on battery state measurement. As described above, the communication unit 210 of the upper-level controller 200 generally repeatedly transmits a signal during a fixed period, and the transmitted command signal includes information on the number of times the signal is repeatedly transmitted during the corresponding period. In addition, the information on the battery state measurement of the command signal may include a trigger signal for measuring a state of the battery module.

The controller 220 may select an intermediate lower-level controller based on strength of the response signal received from the lower-level controller. For example, the strength of the received response signal may be a received signal strength indication (RSSI) value.

The controller 220 may select a lower-level controller whose strength of a response signal received from the lower-level controller is equal to or greater than a preset reference value (first reference value) as the intermediate lower-level controller.

In addition, the control unit 220 may assign priority to the lower-level controller in order in which the strength of the response signal received from the lower-level controller is high, and select a lower-level controller, whose priority is equal to or greater than a preset priority, among the lower-level controllers as the intermediate lower-level controller.

The memory unit 230 may store information on a command signal transmitted from the upper-level controller 200 to the lower-level controller, information on a unique identification ID of the lower-level controller, and battery state data received from the lower-level controller.

Figure 3:
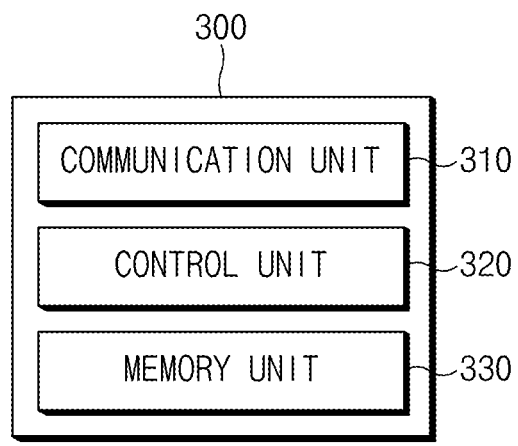
FIG. 3 is a block diagram illustrating a configuration of a lower-level controller according to an embodiment of the present invention.

FIG. 3 is a block diagram illustrating a configuration of a lower-level controller according to an embodiment of the present invention.

Referring to FIG. 3, a lower-level controller 300 according to an embodiment of the present invention may include a communication unit 310, a control unit 320, and a memory unit 330.

For example, the lower-level controller 300 may be the slave battery management system (BMS) described above. In addition, the intermediate lower-level controller is selected from among the lower-level controllers 300 according to a predetermined criterion and is included in the lower-level controller 300.

The communication unit 310 may transmit a response signal to the command signal received from the upper-level controller 200 to the upper-level controller 200. Also, in the case of the intermediate lower-level controller, when the strength of the command signal received from the upper-level controller 200 is less than a preset reference value (second reference value), the communication unit 310 may transmit a signal corresponding to the command signal transmitted by the upper-level controller 200 with maximum power to the remaining lower-level controllers 300. However, the intermediate lower-level controller is not necessarily limited to transmitting a signal corresponding to the command signal with maximum power, and it would also be possible for an intermediate lower controller to transmit a signal with the magnitude equal to or greater than a predetermined reference value.

Alternatively or additionally, when the communication unit 310 of the intermediate lower-level controller fails to receive the command signal as many times as the preset number of times of repetition during a preset period from the upper controller 200, the communication unit 310 of the intermediate lower-level controller may transmit a signal corresponding to the command signal transmitted by the upper controller 200 with maximum power. In this case, when the command signal is not received as many times as the preset number of times of repetition during the preset period from the upper-level controller 200 or the strength of the received command signal is less than the preset second reference value, the communication unit 310 of the intermediate lower-level controller may transmit the signal, which corresponds to the command signal transmitted by the upper-level controller 200, as many times as the remaining number of times obtained by subtracting the number of times of not receiving or less than the second reference value from the preset number of times of repetition to the remaining lower controllers 300 with maximum power.

The control unit 320 may perform an operation according to a command signal received from the upper-level controller 200. That is, when the control unit 320 receives a command signal for measuring the battery state from the host controller 200, the control unit 320 may monitor the voltage, temperature, and state of charge of the battery, and transmit a resulting response signal of monitoring to the upper-level controller 200 again through the communication unit 310.

The memory unit 330 may accumulate and store the strength of the command signal received from the upper-level controller 200. Accordingly, the control unit 320 may determine the reference value (second reference value) based on a median value or an average value of the strength of the stored command signal.

As described above, according to the battery management device according to an embodiment of the present invention, the intermediate lower-level controller transmits a signal corresponding to the command signal received from the upper-level controller 200 to the remaining lower-level controller 300 with maximum power, thereby capable of preventing a situation in which the remaining lower-level controllers 300 (e.g., lower-level controllers 300 far from the upper-level controller 200) do not receive a command signal from occurring even when a communication fault occurs.

On the other hand, in FIGS. 2 and 3, the description is made in such a way that the upper-level controller 200 transmits the command signal to the remaining lower-level controller 300 through the intermediate lower-level controller 300, but is not limited thereto. On the contrary, a method of transmitting the response signals from the remaining lower-level controllers 300 to the upper-level controller 200 through the intermediate lower-level controller may also be possible.

Figure 4:
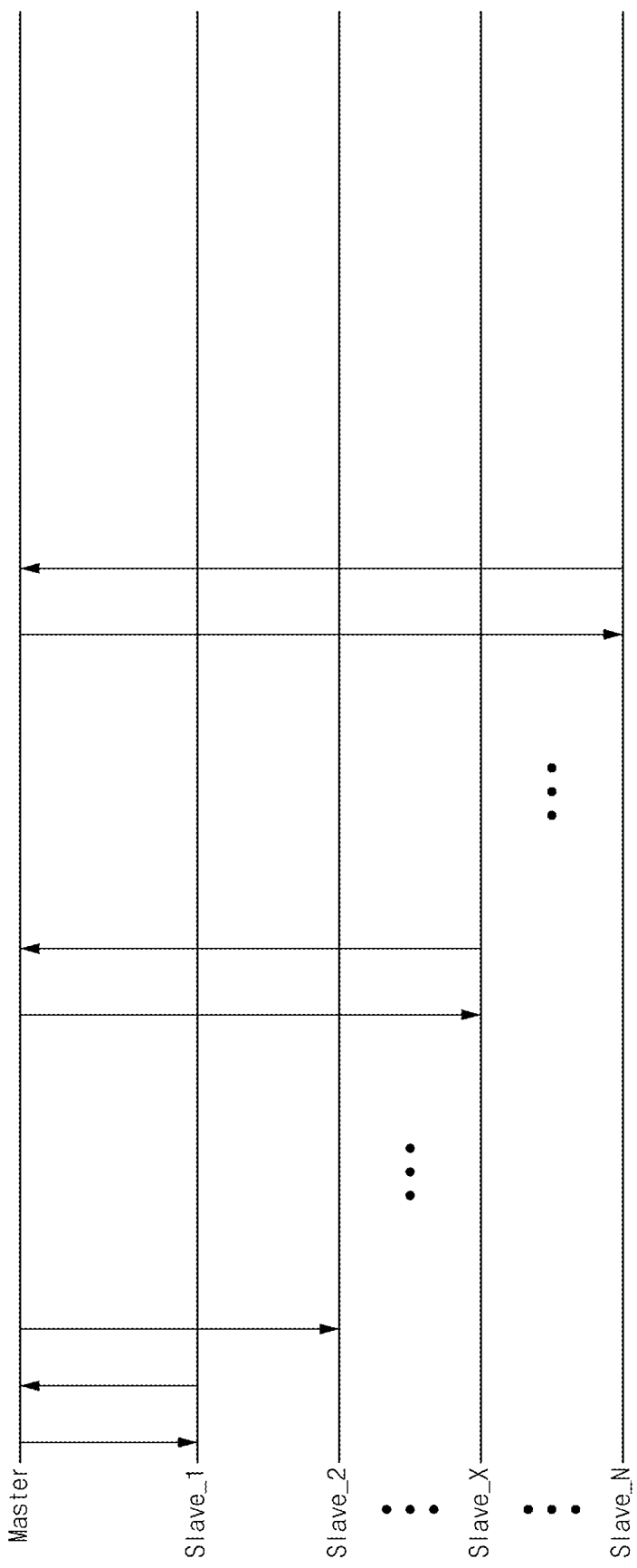
FIG. 4 is a diagram illustrating a communication method of a conventional battery management device.

FIG. 4 is a diagram illustrating a communication method of a conventional battery management device.

Referring to FIG. 4, in the conventional battery management device, signals are transmitted and received between one upper-level controller (master BMS) and a plurality of lower-level controllers (slave BMS) on a one-to-one basis (broadcast method).

That is, in the conventional battery management device, the upper-level controller performs communication in such a way of transmitting a command signal for measuring the state of the battery to each lower-level controller and receiving a response signal to the command from each lower-level controller again.

In addition, when one upper-level controller assigns a unique identification ID to each lower controller when connection with all the lower-level controllers is complete. In this case, the assigned ID is included in the response signal packet of the lower-level controllers, and thus a packet structure is formed so that all the lower-level controllers, including the upper-level controller that receives the response packet, can recognize from which lower-level controller the response packet has been received.

Figure 5:
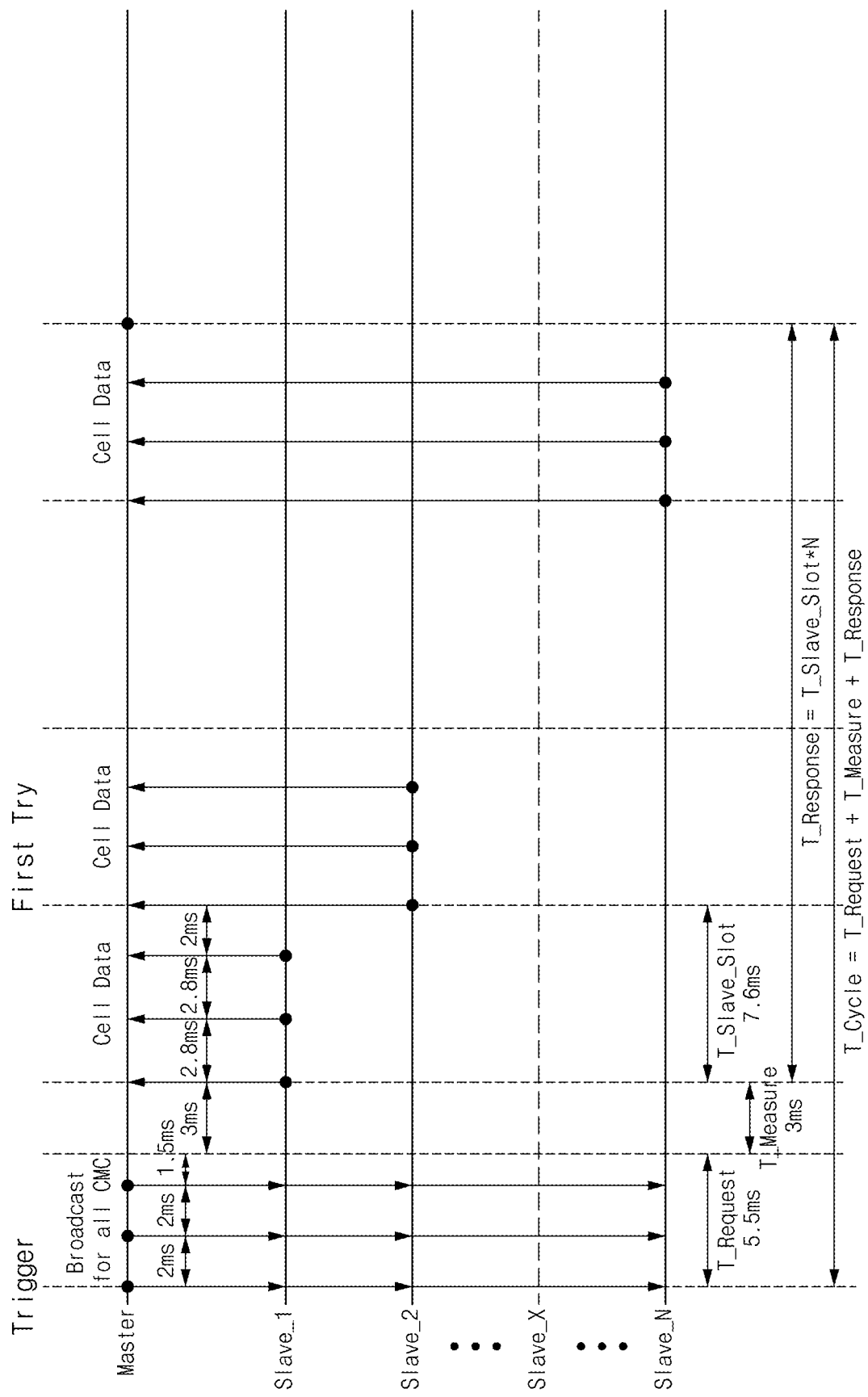
FIG. 5 is a diagram illustrating transmission and reception of signals between a master device and slave devices over time in a conventional battery management device.

FIG. 5 is a diagram illustrating transmission and reception of signals between the master device and the slave devices over time in the conventional battery management device.

Referring to FIG. 5, in the conventional battery management device, the upper-level controller transmits a command signal (e.g., a Measure Trigger signal) several times at a fixed period, thereby minimizing lower-level controllers that fail to receive a signal. In this case, the upper-level controller may transmit the command signal to the lower-level controller as many times as the number of communication protocols promised in advance.

In addition, the lower-level controllers may repeatedly transmit the response signal including measurement data to the upper-level controller at a fixed period allocated according to their respective order. Even in this case, the lower-level controllers may transmit a command signal to the upper-level controller as many times as the number of communication protocols promised in advance.

For example, in FIG. 5, the upper-level controller transmits a command signal three times at intervals of 2 ms for a period of 5.5 ms (T_Request). In addition, each lower-level controller that has received the command signal may measure the state of the battery for 3 ms (T_Measure), and transmit a response signal thereto three times at intervals of 2.8 ms for a period of 7.6 ms (T_Slave_Slot).

Accordingly, if there are a total of N lower-level controllers in the battery management device, a signal transmission and reception period (T_Cycle) between the upper-level controller and the lower-level controllers becomes T_Request+T_Measure+T Response (T_Slave_Slot*N) as illustrated in FIG. 5.

However, according to this conventional method, when a communication fault factor occurs between the upper-level controller and the lower-level controllers, there is a problem that some lower-level controllers fail to receive the signal.

Figure 6:
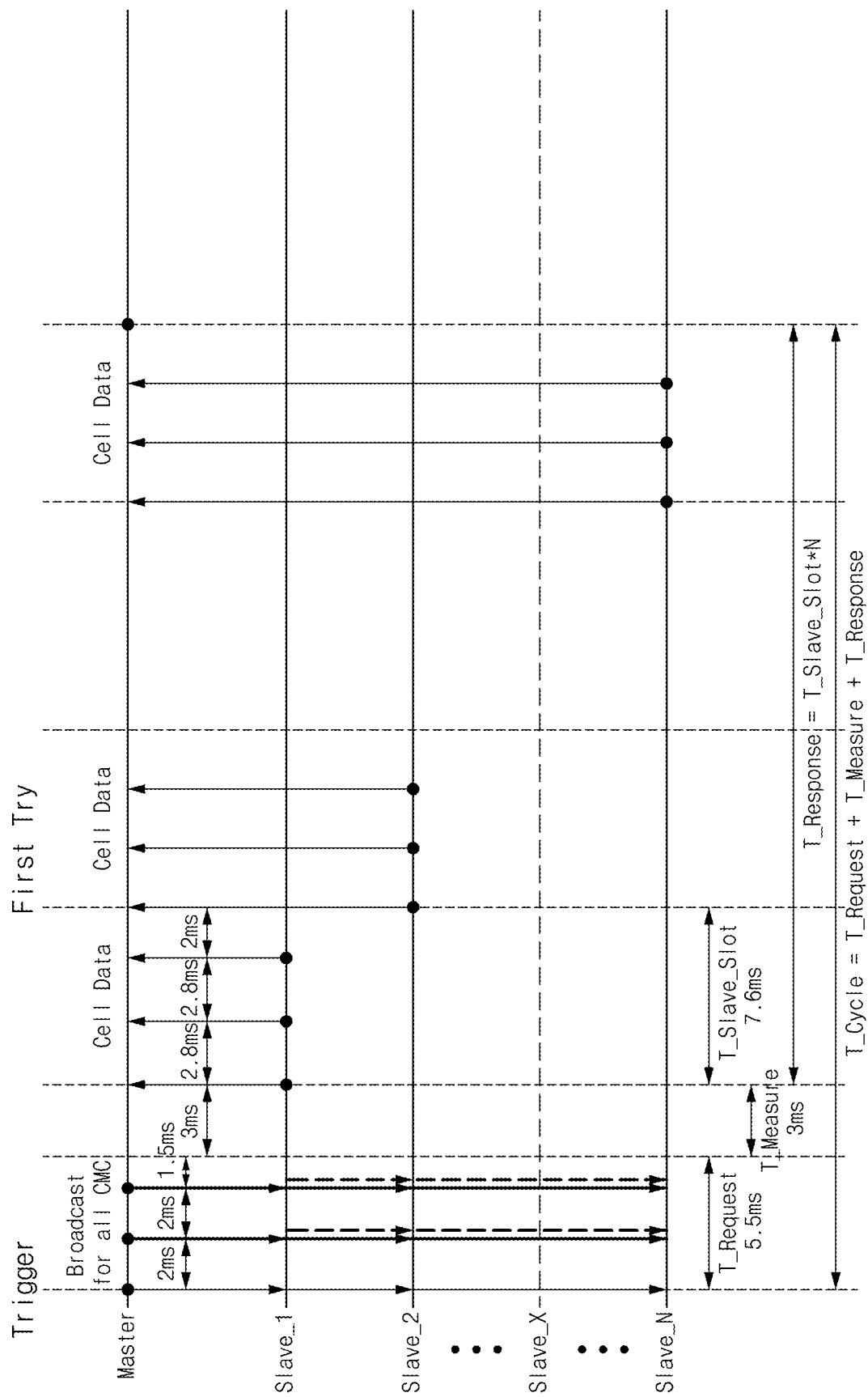
FIG. 6 is a diagram illustrating transmission and reception of signals between a master device and slave devices over time in a battery management device according to an embodiment of the present invention.

FIG. 6 is a diagram illustrating transmission and reception of signals between a master device and slave devices over time in a battery management device according to an embodiment of the present invention. In FIG. 6, since the signal transmission and reception period and the number of repetitions of the upper-level controller and the lower-level controllers are the same as those of FIG. 5, a detailed description thereof will be omitted.

FIG. 6 illustrates a method of communicating between the upper-level controller and the lower-level controllers when Slave_1 and Slave_2 among the lower-level controllers are selected as the intermediate lower-level controllers of FIG. 1. In this case, Slave_1 and Slave_2, which are the intermediate lower-level controllers, may be selected based on the strength of the response signal received by the upper-level controller from the lower-level controllers.

Specifically, the upper-level controller may select a lower-level controller whose strength of the response signal received from the lower-level controller is equal to or greater than a reference value (first reference value) as the intermediate lower-level controller. Alternatively, the upper-level controller may assign priority to the lower-level controller in order in which the strength of the response signal received from the lower-level controller is high, and select a lower-level controller, whose priority is equal to or greater than a preset priority, among the lower-level controllers as the intermediate lower-level controller.

When the strength of the command signal received by Slave_1 and Slave_2, which are intermediate lower-level controllers, from the upper-level controller is less than a preset reference value (second reference value), a signal corresponding to the command signal received from the upper-level controller may be transmitted with maximum power to the remaining lower-level controllers (i.e., Slave_3 to Slave_N). In this case, Slave_1 and Slave_2 may accumulate and store the strength of the command signal received from the upper-level controller, and may determine the reference value (second reference value) based on a median value or an average value of the strength of the stored command signal.

In addition, when Slave_1 and Slave_2, which are the intermediate lower-level controllers, fail to receive the command signal as many times as the preset number of times of repetition during the preset period from the upper-level controller, Slave_1 and Slave_2 may transmit a signal corresponding to the command signal received from the upper-level controller with maximum power. In this case, when the command signal is not received from the upper-level controller as many times as the preset repetition number during a preset period or the strength of the received command signal is less than a preset reference value (second reference value), Slave_1 and Slave_2 may not receive a signal corresponding to the command signal received from the upper-level controller at a prescribed number of times with the upper-level controller, or may transmit to the remaining lower-level controllers with maximum power as many times as less than the second reference value.

For example, in FIG. 6, when the RSSI of the command signal received for the first time from the upper-level controller of Slave_1 and Slave_2, which are intermediate lower-level controllers, is lower than an intermediate value (or average value), Slave_1 and Slave_2 may broadcast command signals with maximum power when transmitting the command signal to the remaining lower controllers Slave_3 to Slave_N for the second and third times.

As such, according to the battery management device according to the embodiment of the present invention, communication between the battery management systems can be made in good condition by performing wireless communication using the intermediate node even when a communication fault occurs between nodes.

On the other hand, the communication periods or times (e.g., T_Request, T_Measure, T_Slave_Slot, etc.) illustrated in FIGS. 5 and 6 are illustrated as examples for the description of the present invention, and the present invention is not limited to these periods or times. That is, the communication period or time of the battery management device according to the embodiment of the present invention may be set in various ways according to a packet size and a communication environment.

Figure 7:
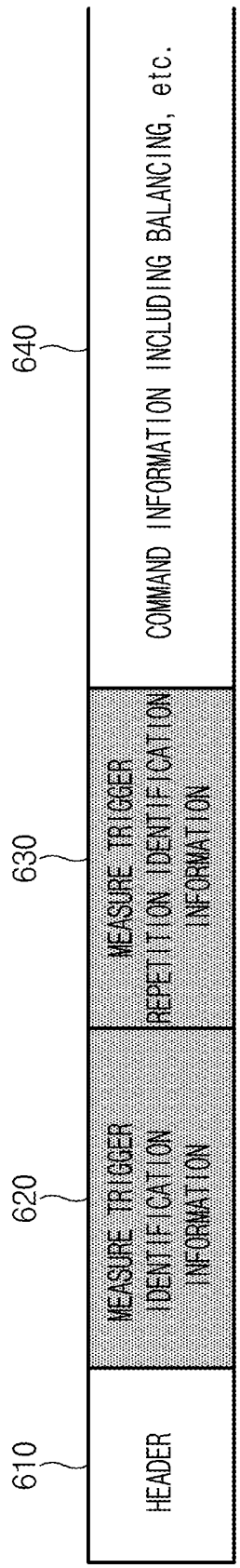
FIG. 7 is a diagram illustrating a packet of a signal transmitted from the master device (upper-level controller) according to an embodiment of the present invention.

FIG. 7 is a diagram illustrating a packet of a signal transmitted from the master device (upper-level controller) according to an embodiment of the present invention.

Referring to FIG. 7, the command signal of the upper-level controller according the embodiment of the present invention may include a header 610, Measure Trigger identification information 620, Measure Trigger repetition number identification information 630, and command information 640 including balancing, etc.

The header 610 is a character group placed at the top of the command signal and may function to identify or control the contents and characteristics of data included in the signal.

The Measure Trigger identification information 620 makes it possible to identify Measure Trigger at a specific timing and previous Measure Triggers. For example, the Measure Trigger identification information 620 may include the unique identification ID of the signal described above.

The Measure Trigger repetition number identification information 630 may include information on a transmission period of a signal and the number of repetitions during the transmission period so as to detect omission of the number of repetitions of the signal transmitted and received by the upper or lower-level controller during a fixed period.

The command information 640 including Balancing, etc. may include information on measuring the state of the battery (e.g., information on measuring the voltage, temperature, SOC, etc. of the battery), and information on balancing of each battery cell (e.g., balancing cycle, information about voltage, etc.).

Figure 8:
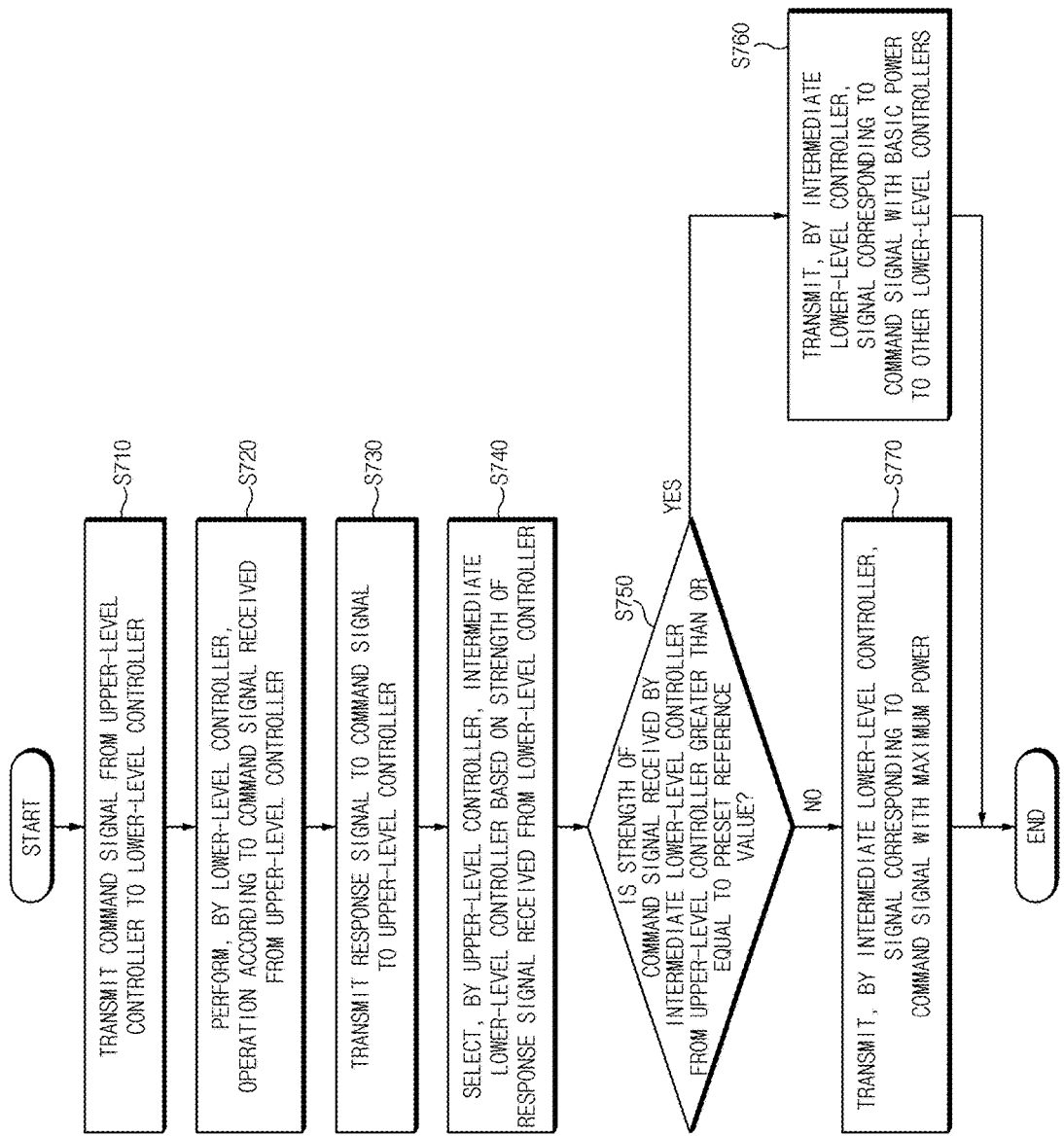
FIG. 8 is a flowchart illustrating a battery management method according to an embodiment of the present invention.

FIG. 8 is a flowchart illustrating a battery management method according to an embodiment of the present invention.

Referring to FIG. 8, first, a command signal is transmitted from an upper-level controller to a lower-level controller (S710). For example, the upper-level controller may include a Measure Trigger signal that causes the lower-level controller to measure the state of the battery.

The lower-level controller receiving the command signal performs an operation according to the command signal received from the upper-level controller (S720). In this case, the lower-level controller may monitor the states such as voltage, temperature, and SOC of the battery according to the command signal from the upper-level controller.

Then, the lower-level controller transmits a response signal to the command signal to the upper-level controller (S730). For example, the response signal transmitted to the upper-level controller may include result data regarding the states such as the voltage, temperature, and SOC of the battery.

The upper-level controller that has received the response signal selects an intermediate lower-level controller according to a predetermined criterion among the lower-level controllers. In this case, the upper-level controller may select the intermediate lower-level controller based on the strength of the response signal received from the lower-level controller (S740).

For example, the upper-level controller may select a lower-level controller whose strength of the response signal received from the lower-level controller is equal to or greater than a preset reference value (first reference value) as the intermediate lower-level controller.

In addition, the upper-level controller may assign priority to the lower-level controller in order in which the strength of the response signal received from the lower-level controller is high, and select a lower-level controller, whose priority is equal to or greater than a preset priority, among the lower-level controllers as the intermediate lower-level controller.

Next, the intermediate lower-level controller determines whether or not the strength of the command signal received from the upper-level controller is equal to or greater than a preset reference value (second reference value) (S750). If the strength of the command signal received from upper-level controller is equal to or greater than the preset reference value (second reference value) (YES), since there is no communication fault, the intermediate lower-level controller may transmit a signal corresponding to the command signal received from the upper-level controller with basic power to other lower-level controllers (S760).

However, if the strength of the command signal received from the upper-level controller is less than the preset reference value (second reference value) (NO), the intermediate lower-level controller transmits the signal corresponding to the command signal received from the upper-level controller with maximum power to other lower-level controllers (S770). As described above, the intermediate lower-level controller need not necessarily transmit a signal with maximum power, and may transmit a signal with power equal to or greater than a predetermined reference value.

Figure 9:
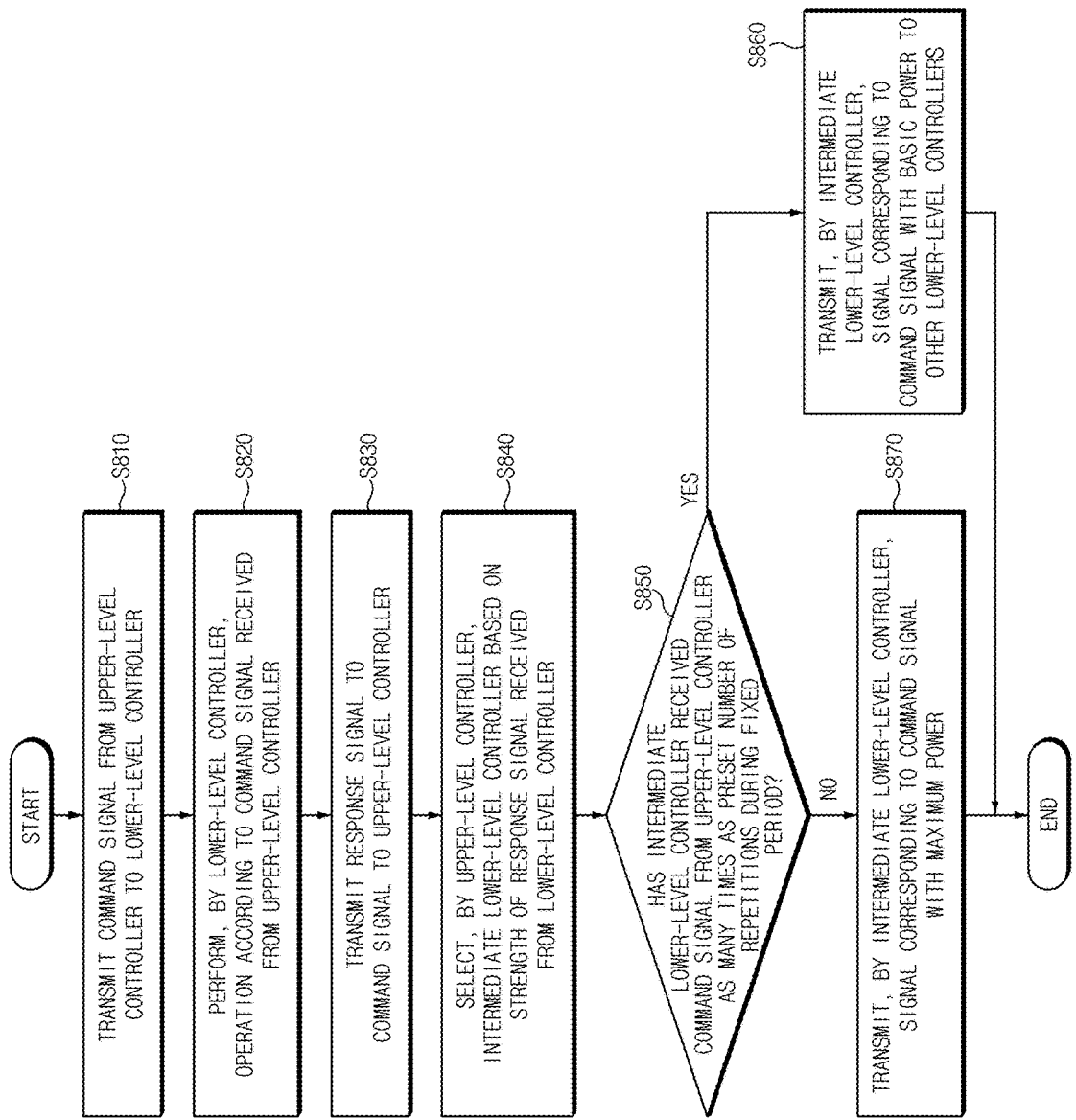
FIG. 9 is a flowchart illustrating a battery management method according to another embodiment of the present invention.

FIG. 9 is a flowchart illustrating a battery management method according to another embodiment of the present invention.

Steps S810 to S840 of FIG. 9 are substantially the same as steps S710 to S740 of FIG. 8, and thus the detailed description thereof will be omitted.

Referring to FIG. 9, after the upper-level controller selects the intermediate lower-level controller in step S840, the intermediate lower-level controller determines whether or not a command signal has been received from the upper-level controller as many times as a preset number of times of repetition during a fixed period (S850).

If the intermediate lower-level controller has received the command signal from the upper-level controller as many times as the preset number of times of repetition during the fixed period (YES), since there is no communication fault, the intermediate lower-level controller may transmit the command signal to other controllers with basic power (S860).

However, if the intermediate lower-level controller does not receive the command signal from the upper-level controller as many times as the preset number of times of repetition during the fixed period (NO), the intermediate lower-level controller transmits the command signal to other controllers with maximum power (S870).

In this case, when the command signal is not received from the upper-level controller as many times as the preset number of times of repetition during the preset period (or when the strength of the received command signal is less than the preset reference value (second reference value)), the intermediate lower-level controller may transmit a signal corresponding to the command signal received from the upper controller as many times as the remaining number of times obtained by subtracting the number of times (or less than the reference value (second reference value)) the command signal is not received from the preset number of times of repetition to the remaining lower controllers with maximum power.

As such, according to the battery management method according to the embodiment of the present invention, it is possible to enable good communication between battery management systems by performing wireless communication using an intermediate node even when a communication fault occurs between nodes.

Figure 10:
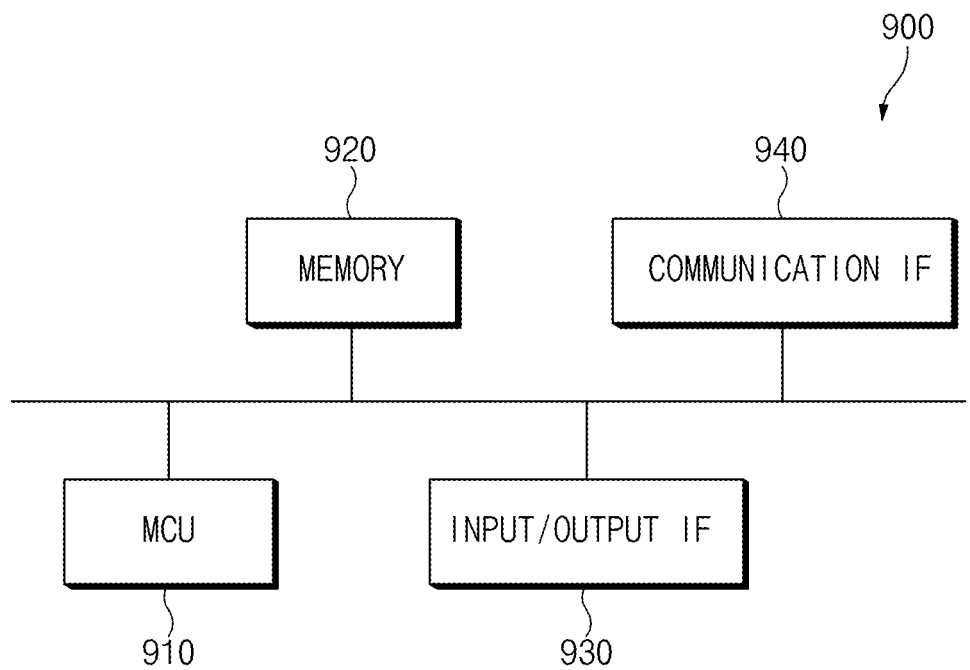
FIG. 10 is a diagram illustrating a hardware configuration of the battery management device according to the embodiment of the present invention.

FIG. 10 is a diagram illustrating a hardware configuration of a battery management device according to an embodiment of the present invention.

As illustrated in FIG. 10, a battery management device 900 may include a microcontroller (MCU) 910 that controls various processing and each configuration, a memory 920 in which an operating system program and various programs (e.g., a battery pack abnormality diagnosis program or a battery pack temperature estimation program) are recorded, an input/output interface 930 that provides input interface and output interface between a battery cell module and/or a switching unit (e.g., a semiconductor switching device), and a communication interface 940 capable of communicating with the outside (for example, an upper-level controller) through a wired or wireless communication network. As described above, a computer program according to the present invention may be recorded in the memory 920 and processed by the microcontroller 910, thereby capable of being implemented as, for example, a module that performs each functional block illustrated in FIG. 2.

In the above description, just because all constituent elements constituting an embodiment of the present invention are described as being combined into one or operating in combination, the present invention is not necessarily limited to these embodiments. That is, as long as it is within the scope of the object of the present invention, all constituent elements may be selectively combined and operated in one or more.

In addition, the terms such as "include", "configure" or "have" described above mean that the corresponding constituent element may be embedded unless otherwise described, and thus the terms should be interpreted as being capable of further including other constituent elements, rather than excluding other constituent elements. All terms used herein including technical or scientific terms may have the same meaning as generally understood by a person of ordinary skill in the art, unless otherwise defined. Terms generally used, such as terms defined in the dictionary, should be interpreted as being consistent with the meaning of the context of related technology, and are not to be interpreted as an ideal or excessively formal meaning unless explicitly defined in the present invention.

The above description is merely illustrative of the technical idea of the present invention, and those of ordinary skill in the art to which the present invention pertains will be able to make various modifications and variations without deviating from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the claims set forth below, and all technical ideas within the scope equivalent thereto should be construed as being included in the scope of the present invention.

The invention claimed is:

1. A battery management device, comprising:
an upper-level controller configured to:
    transmit a command signal to a plurality of lower-level controllers;
    receive response signals to the command signal from the plurality of lower-level controllers, respectively; and
    select an intermediate lower-level controller among the plurality of lower-level controllers based on a predetermined criterion; and
the plurality of lower-level controllers, each configured to:
    perform an operation according to the command signal received from the upper-level controller; and
    transmit the respective response signal to the command signal to the upper-level controller,
wherein the intermediate lower-level controller is configured to transmit, with a maximum power, a signal corresponding to the command signal transmitted by the upper-level controller to the remaining lower-level controllers, among the plurality of lower-level controllers, if a strength of the command signal received by the intermediate lower-level controller from the upper-level controller is less than a preset first reference value.

2. The device of claim 1, wherein the intermediate lower-level controller is further configured to:
accumulate and store the strength of the command signal received from the upper-level controller; and
determine the preset first reference value based on a median value or an average value of the stored strength of the command signal received from the upper-level controller.

3. The device of claim 1, wherein each of the command signal and the response signals includes at least one of: a signal-specific identification information, identification information on a number of repetitions of the command signal, and information on a battery state measurement.

4. The device of claim 1, wherein the command signal includes a trigger signal for measuring a state of battery module.

5. The device of claim 1, wherein:
the upper-level controller is further configured to transmit the command signal as many times as a preset number of times of repetition during a preset period; and
the intermediate lower-level controller is further configured to transmit, with the maximum power, the signal corresponding to the command signal to the remaining lower-level controllers, among the plurality of lower-level controllers, if the command signal has not been received from the upper-level controller as many times as the preset number of times of repetition during the preset period.

6. The device of claim 5, wherein, if the command signal has not been received by the intermediate lower-level controller from the upper-level controller as many times as the preset number of times of repetition during the preset period or the strength of the command signal received by the intermediate lower-level controller is less than the preset first reference value, the intermediate lower-level controller is further configured to transmit, with the maximum power, the signal corresponding to the command signal to the remaining lower-level controllers a number of times equaling the preset number of times of repetition less the number of times the command signal has been received from the upper-level controller.

7. The device of claim 1, wherein the upper-level controller is further configured to select the intermediate lower-level controller based on strengths of the response signals received respectively from the lower-level controllers.

8. The device of claim 7, wherein the upper-level controller is further configured to select a lower-level controller the strength of whose response signal received by the upper-level controller is equal to or greater than a preset second reference value, among the lower-level controllers, as the intermediate lower-level controller.

9. The device of claim 7, wherein the upper-level controller is further configured to:
- assign a priority to each of the lower-level controllers according to the strengths of the response signals respectively from the lower-level controllers descending from high to low strengths; and
- select a lower-level controller, whose priority is equal to or greater than a preset priority, among the lower-level controllers, as the intermediate lower-level controller.

10. A battery management device, comprising:
an upper-level controller configured to:
- transmit a command signal to a plurality of lower-level controllers;
- receive response signals to the command signal from the plurality of lower-level controllers, respectively; and
- select an intermediate lower-level controller among the plurality of lower-level controllers based on a predetermined criterion; and the plurality of lower-level controllers, each configured to:
- perform an operation according to the command signal received from the upper-level controller; and
- transmit the respective response signal to the command signal to the upper-level controller, wherein:
the intermediate lower-level controller is configured to transmit, with a maximum power, a signal corresponding to the command signal transmitted by the upper-level controller to the remaining lower-level controllers, among the plurality of lower-level controllers, if a strength of the command signal received by the intermediate lower-level controller from the upper-level controller satisfies a preset condition;
the upper-level controller is further configured to transmit the command signal as many times as a preset number of times of repetition during a preset period; and
the intermediate lower-level controller is further configured to transmit, with the maximum power, a signal corresponding to the command signal transmitted by the upper-level controller to the remaining lower-level controllers, among the plurality of lower-level controllers, if the command signal has not been received as many times as the preset number of times of repetition during the preset period from the upper-level controller.

11. The device of claim 10, wherein, if the command signal has not been received as many times as the preset number of times of repetition during the preset period from the upper-level controller or the strength of the command signal received by the intermediate lower-level controller is less than a preset first reference value, the intermediate lower-level controller is further configured to transmit, with the maximum power, the signal corresponding to the command signal to the remaining lower-level controllers a number of times equaling the preset number of times of repetition less the number of times the command signal has been received from the upper-level controller.

12. A battery management method, comprising:
- transmitting a command signal from an upper-level controller to a plurality of lower-level controllers;
- performing, by each of the plurality of lower-level controllers, an operation according to the command signal received from the upper-level controller;
- transmitting, by each of the plurality of lower-level controllers, a response signal to the command signal to the upper-level controller;
- selecting, by the upper-level controller, an intermediate lower-level controller according to a predetermined criterion among the plurality of lower-level controllers; and
- transmitting, by the intermediate lower-level controller with a maximum power, a signal corresponding to the command signal transmitted by the upper-level controller to the remaining lower-level controllers, among the plurality of lower-level controllers, if a strength of the command signal received by the intermediate lower-level controller from the upper-level controller is less than a preset first reference value.

13. The method of claim 12, further comprising:
transmitting, by the upper-level controller, the command signal as many times as a preset number of times of repetition during a preset period,
wherein the transmitting by the intermediate lower-level controller further includes transmitting, with the maximum power, the signal corresponding to the command signal transmitted by the upper-level controller to the remaining lower-level controllers, among the plurality of lower-level controllers, if the command signal has not been received as many times as the preset number of times of repetition during the preset period from the upper-level controller.

14. The method of claim 13, wherein the transmitting by the intermediate lower-level controller further includes:
if the command signal has not been received by the intermediate lower-level controller as many times as the preset number of times of repetition during the preset period from the upper-level controller or the strength of the command signal received by the intermediate lower-level controller is less than the preset first reference value, transmitting the signal corresponding to the command signal to the remaining lower-level controllers with the maximum power a number of times equaling the preset number of times of repetition less the number of times the command signal has been received from the upper-level controller.

* * * * *